United States Patent
Jeung

(10) Patent No.: US 10,211,810 B2
(45) Date of Patent: Feb. 19, 2019

(54) ACOUSTIC WAVE FILTER AND METHOD FOR MANUFACTURING THE SAME

(71) Applicant: SAMSUNG ELECTRO-MECHANICS CO., LTD., Suwon-si (KR)

(72) Inventor: Won Kyu Jeung, Suwon-si (KR)

(73) Assignee: Samsung Electo-Mechanics Co., Ltd., Suwon-si (KR)

( * ) Notice: Subject to any disclaimer, the term of this patent is extended or adjusted under 35 U.S.C. 154(b) by 120 days.

(21) Appl. No.: 15/286,182

(22) Filed: Oct. 5, 2016

(65) Prior Publication Data

US 2017/0237411 A1 Aug. 17, 2017

(30) Foreign Application Priority Data

Feb. 17, 2016 (KR) .................. 10-2016-0018316

(51) Int. Cl.
| | |
|---|---|
| *H03H 9/54* | (2006.01) |
| *H03H 3/04* | (2006.01) |
| *H03H 9/205* | (2006.01) |
| *H03H 3/02* | (2006.01) |
| *H03H 9/58* | (2006.01) |
| *H03H 9/02* | (2006.01) |

(52) U.S. Cl.
CPC ............ *H03H 9/54* (2013.01); *H03H 3/02* (2013.01); *H03H 3/04* (2013.01); *H03H 9/02007* (2013.01); *H03H 9/205* (2013.01); *H03H 9/587* (2013.01); *H03H 2003/028* (2013.01); *H03H 2003/0421* (2013.01); *H03H 2003/0428* (2013.01); *H03H 2009/02173* (2013.01)

(58) Field of Classification Search
CPC ...... H03H 3/02; H03H 3/04; H03H 2003/021; H03H 2003/028; H03H 2003/0421; H03H 2003/0428; H03H 2003/0471; H03H 9/02007; H03H 9/131; H03H 9/205; H03H 9/54; H03H 9/568; H03H 9/587; H03H 9/605; H03H 2009/02165; H03H 2009/02173
USPC ................................ 333/188, 189; 310/312
See application file for complete search history.

(56) References Cited

U.S. PATENT DOCUMENTS

| | | | | |
|---|---|---|---|---|
| 6,307,447 B1 * | 10/2001 | Barber | ..................... | H03H 3/04 29/25.35 |
| 6,339,276 B1 * | 1/2002 | Barber | .................... | G04F 5/063 310/312 |
| 6,483,229 B2 * | 11/2002 | Larson, III | ............... | H03H 3/04 310/348 |

(Continued)

FOREIGN PATENT DOCUMENTS

| | | |
|---|---|---|
| JP | 2008-113061 A | 5/2008 |
| JP | 2011-41136 A | 2/2011 |

(Continued)

*Primary Examiner* — Barbara Summons
(74) *Attorney, Agent, or Firm* — NSIP Law

(57) ABSTRACT

An acoustic wave filter includes a substrate having voids formed therein; a first resonator disposed on one or more of the voids, and a second resonator disposed on other of the voids. A first trimming layer is provided in the first resonator, and a second trimming layer is provided in the second resonator. The second trimming layer is formed of a material having an etching rate for a given etchant different from that of the first trimming layer.

16 Claims, 5 Drawing Sheets

(56) References Cited

U.S. PATENT DOCUMENTS

| | | | | |
|---|---|---|---|---|
| 6,864,619 | B2* | 3/2005 | Aigner | H03H 3/04 310/312 |
| 6,943,648 | B2* | 9/2005 | Maiz | H03H 3/04 310/312 |
| 7,275,292 | B2* | 10/2007 | Ruby | H03H 3/02 29/25.35 |
| 8,049,581 | B2* | 11/2011 | Iwasaki | H03H 3/04 310/312 |
| 2004/0017269 | A1* | 1/2004 | Gotoh | H03H 3/04 333/133 |
| 2006/0006965 | A1* | 1/2006 | Ishii | H03H 3/04 333/191 |
| 2009/0147203 | A1* | 6/2009 | Tomihari | G02F 1/136209 349/147 |
| 2011/0250706 | A1* | 10/2011 | Huff | B81C 99/006 438/5 |
| 2012/0146744 | A1 | 6/2012 | Nishihara et al. | |
| 2012/0161905 | A1 | 6/2012 | Lee et al. | |
| 2014/0231382 | A1* | 8/2014 | Araki | H03H 3/02 216/17 |
| 2017/0213915 | A1* | 7/2017 | Jongman | H01L 51/105 |

FOREIGN PATENT DOCUMENTS

| | | |
|---|---|---|
| KR | 10-2005-0072576 A | 7/2005 |
| KR | 10-2012-0071233 A | 7/2012 |

* cited by examiner

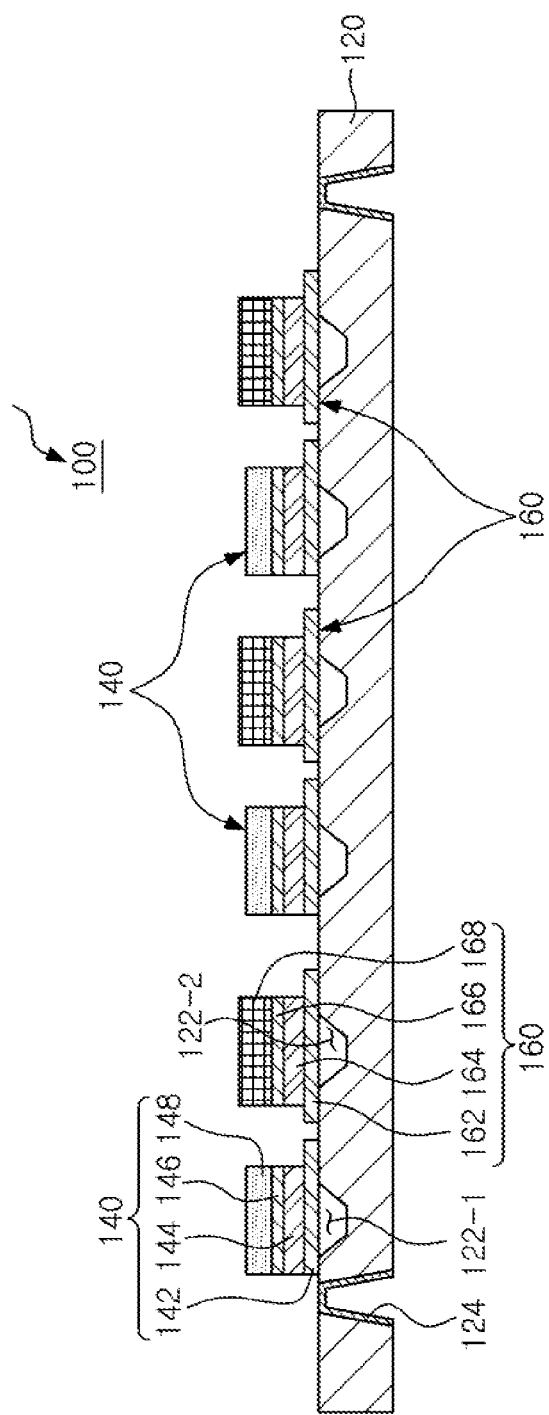
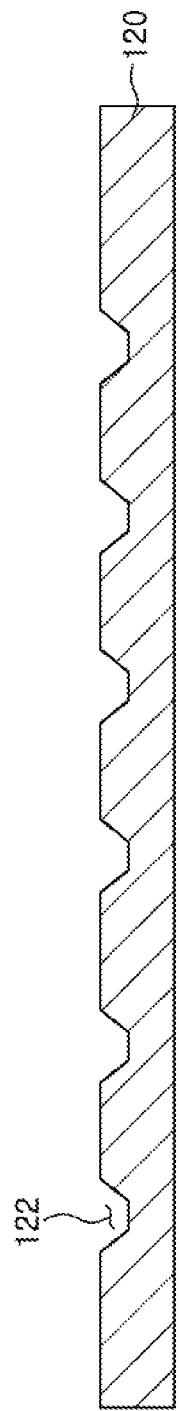

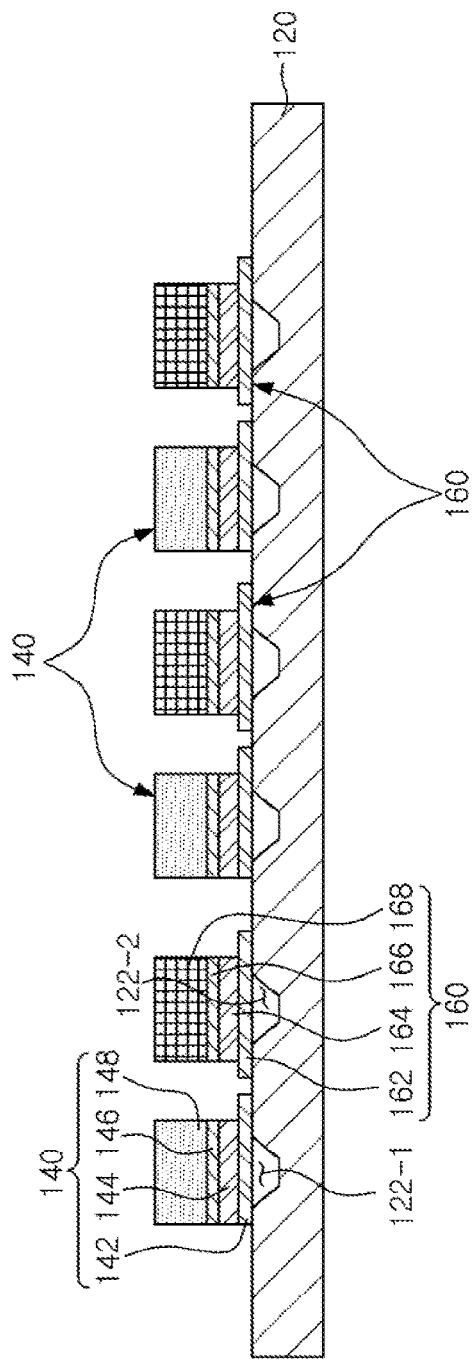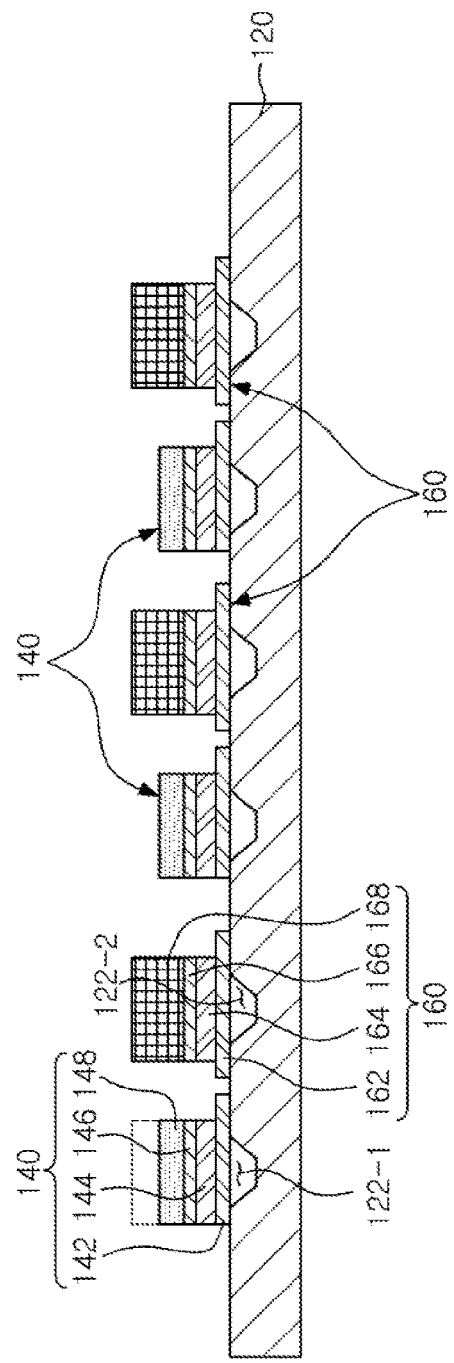
FIG. 7
FIG. 8

ACOUSTIC WAVE FILTER AND METHOD FOR MANUFACTURING THE SAME

CROSS-REFERENCE TO RELATED APPLICATION(S)

This application claims benefit of priority under 35 U.S.C. § 119(a) to Korean Patent Application No. 10-2016-0018316 filed on Feb. 17, 2016 in the Korean Intellectual Property Office, the entire disclosure of which is incorporated herein by reference for all purposes.

BACKGROUND

1. Field

The present disclosure relates to an acoustic wave filter and a method for manufacturing the same.

2. Description of Related Art

As bandwidth specifications for high performance band pass filters have tightened, precise trimming characteristics for piezoelectric resonators are desirable.

Typically, an acoustic filter includes a series resonator which determines the right frequency of a band, and a shunt resonator which determines the left frequency of a band. Conventional trimming processes are performed separately for the series resonator and the shunt resonator using techniques such as, for example, ion beam etching. Alternatively, such trimming processes may be performed as two processes, in which, after the trimming process is simultaneously performed for the series resonator and the shunt resonator, a further trimming process is performed only for the shunt resonator (or the series resonator).

Such trimming processes require a photomask and an additional photo process capable of opening only one of the series resonator and the shunt resonator.

Therefore, fabrication processes such as an additional photomask process, a photolithography process, and the like, are performed on a structure. In other words, such trimming processes require photolithography in two steps. Accordingly, conventional fabrication process for acoustic wave resonators may have a low yield and precision. Improvements in fabrication process are, therefore, desirable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave filter includes a substrate having voids formed therein, a first resonator disposed on one or more of the voids, and a second resonator disposed on other of the voids. A first trimming layer is provided in the first resonator, and a second trimming layer is provided in the second resonator. The second trimming layer is formed of a material having an etching rate for a given etchant different from that of the first trimming layer.

The first resonator may include a first lower electrode disposed on a corresponding void, a first piezoelectric body disposed on a top surface of the first lower electrode, a first upper electrode disposed on a top surface of the first piezoelectric body, and the first trimming layer disposed on a top surface of the first upper electrode. Top surface of the first lower electrode is opposite a bottom surface of the first lower electrode, the bottom surface of the first lower electrode facing the corresponding void.

The second resonator may include a second lower electrode disposed on a corresponding void, a second piezoelectric body disposed on a top surface of the second lower electrode, a second upper electrode disposed on a top surface of the second piezoelectric body, and the second trimming layer disposed on a top surface of the second upper electrode. Top surface of the second lower electrode is opposite a bottom surface of the second lower electrode, the bottom surface of the second lower electrode facing the corresponding void.

The voids may be funnel-shaped with an upper portion being wide and a lower portion is narrow. The first lower electrode and the second lower electrode are sized to cover and seal the upper portion of corresponding voids.

The first trimming layer and the second trimming layer may have different etching rates for a given etchant, configured to prevent one from being etched while etching another.

In another general aspect, a method of manufacturing an acoustic wave filter includes forming a plurality of voids in a substrate, forming a first lower electrode and a second lower electrode to be disposed on the voids, forming a first piezoelectric body and a second piezoelectric body on the first lower electrode and the second lower electrode respectively, forming a first upper electrode and a second upper electrode on the first piezoelectric body and the second piezoelectric body respectively, forming a first trimming layer on the first upper electrode, and forming a second trimming layer on the second upper electrode. The first trimming layer and the second trimming layer comprise materials having different etching rates for a given etchant.

The method may further include after the forming of the second trimming layer, planarizing the first trimming layer.

The planarizing the first trimming layer may include etching a portion of the first trimming layer.

The planarizing the first trimming layer may include one of reactive ion etching and ion beam etching.

The method may further include after planarizing the first trimming layer, planarizing the second trimming layer.

The planarizing the second trimming layer may include etching a portion of the second trimming layer.

The planarizing the second trimming layer may include one of reactive ion etching and ion beam etching.

The first trimming layer and the second trimming layer may have different etching rates for a given etchant, configured to prevent one from being etched while etching another.

The forming of the first trimming layer may include stacking the first trimming layer, and planarizing the first trimming layer through etching.

The forming of the second trimming layer may include stacking the second trimming layer, and planarizing the second trimming layer through etching.

In another general aspect, an acoustic wave filter includes a first acoustic resonator having a first trimming layer disposed thereon, and a second acoustic resonator having a second trimming layer disposed thereon. The first trimming layer has a different etching rate for a given etchant than the second trimming layer.

The first acoustic resonator and the second acoustic resonator may each include a lower electrode disposed on a void provided in a substrate, a piezoelectric body disposed on the lower electrode, and an upper electrode disposed on the piezoelectric body.

The first trimming layer and the second trimming layer may be formed of materials selected such that a given etchant that etches the first trimming layer causes no or negligible etching of the second trimming layer, and vice versa.

Other features and aspects will be apparent from the following detailed description, the drawings, and the claims.

BRIEF DESCRIPTION OF DRAWINGS

FIG. 1 schematically illustrates a cross-section of an acoustic wave filter according to an embodiment.

FIG. 2 schematically illustrates a cross-section of the acoustic wave filter during manufacturing using a method according to an embodiment.

FIG. 7 schematically illustrates a cross-section of the acoustic wave filter during forming a second trimming layer of the acoustic wave filter.

FIG. 8 schematically illustrates a cross-section of the acoustic wave filter during planarizing the first trimming layer of the acoustic wave filter.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 3:
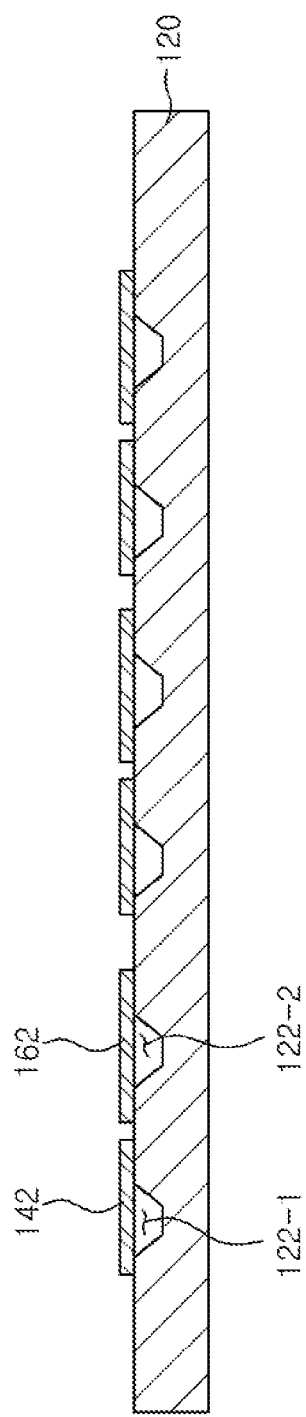
FIG. 3 schematically illustrates a cross-section of the acoustic wave filter during forming first and second lower electrodes of the acoustic wave filter.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The contents of the present disclosure described below may have a variety of configurations and propose only a required configuration herein, but are not limited thereto.

FIG. 1 schematically illustrates a cross-section of an acoustic wave filter according to an embodiment.

Referring to FIG. 1, an acoustic wave filter 100 according to an embodiment includes a substrate 120, a first resonator 140, and a second resonator 160.

The substrate 120 may be a suitable semiconductor substrate such as, for example, a silicon substrate, a silicon on insulator (SOI) type substrate, or a substrate of any other material amenable to semiconductor manufacturing processes.

As used herein, the term "suitable" material refers to a material having physical and chemical properties requisite for part or component for which the material is being used. In addition, the material is compatible to the manufacturing methods being used in making or fabricating the part, component, or the device as a whole. While examples are provided for suitable materials where applicable, the disclosure of this application is not limited to the example materials, and encompasses other suitable materials that will be apparent after an understanding of the disclosure of this application.

Voids 122 (122-1, 122-2) are formed in the substrate 120. As an example, the voids 122 may be formed by a groove formed from a top surface of the substrate 120. However, the voids 122 are not limited thereto, but may also be formed by a hole penetrating through the substrate 120.

It will be apparent after an understanding of the disclosure of the present application that although FIG. 1 illustrates an example in which six voids 122 are formed in the substrate 120, the number of voids 122 are not limited thereto. Further, while FIG. 1 illustrates the voids 122 having a trapezoidal shape the cross-sectional shape of the voids 122 is not limited thereto and will depend on the process used to make the cavity forming the voids 122. For example, the walls of the voids 122 may be straight (perpendicular to the top surface of the substrate, or at a different angle) or curved.

Via holes 124 are formed across a thickness of the substrate 120 at suitable locations. For example, via holes 124 may be formed near the edges of the substrate 120. In some embodiments, via holes 124 may be formed periodically in an array. For example, a given substrate may be divided into four quadrants with each quadrant having a via hole at each corner of each of the quadrants.

Although not explicitly illustrated in the drawings, an insulating layer for electrically isolating the substrate 120 from the first resonator 140 and the second resonator 160 may be formed on the top surface of the substrate 120. The insulating layer may be formed of a suitable dielectric material such as, for example, silicon dioxide ($SiO_2$), silicon nitride ($Si_3N_4$), or aluminum oxide ($Al_2O_3$). The insulating layer may be formed by depositing the dielectric material on the substrate 120 by a suitable method such as, for example, chemical vapor deposition, RF magnetron sputtering, or evaporation.

The first resonator 140 is disposed on at least one of the voids 122-1. The first resonator 140 may be a series resonator. In some embodiments, the first resonator 140 may be a bulk acoustic wave filter. In an embodiment, the first resonator 140 may include a first lower electrode 142, a first piezoelectric body 144, a first upper electrode 146, and a first trimming layer 148. In such an embodiment, the first lower electrode 142 is disposed on the void 122-1, and serves to apply a high frequency voltage to the first piezoelectric body 144. Accordingly, the first lower electrode 142 may be formed of a suitable electrically conducting material such as, for example, manganese (Mn), gold (Au), aluminum (Al), copper (Cu), and silver (Ag), or conducting alloys thereof. The first lower electrode 142 may have a predetermined thickness and be formed by a suitable thin film deposition process such as, for example, sputtering, CVD, or evaporation. The first electrode 142 may have any suitable shape such as, for example, a circle, an ellipse, a square, a triangle, a convex regular or irregular polygon, or any other suitable shape that serves to optimize the geometric and acoustic efficiency of the resonators. The shape of the first lower electrode 142 can be provided using a suitable process such as, for example, photolithography.

An appropriate thickness of the first lower electrode 142 may be determined by considering factors such as, for example, intrinsic acoustic impedance or density of the material, speed of sound, and wavelength of an applied or desired signal in order for the bulk acoustic wave (BAW) resonator to exhibit desired resonance characteristics.

The first lower electrode 142 may be sized such that the first lower electrode 142 seals the void 122-1 from the top.

The first piezoelectric body 144 is formed on a top surface of the first lower electrode 142. In such configuration, the first lower electrode 142 is between the substrate 120 and the first piezoelectric body 144. The first piezoelectric body 144 may be formed of a suitable piezoelectric material such as, for example, quartz, zinc oxide (ZnO), aluminum nitride (AlN), lead zirconate titanate (PZT), barium titanate ($BaTiO_3$), or any variations thereof. In addition, the first piezoelectric body 144 may be stretched according to a high frequency electrical signal applied by the first lower electrode 142 and the first upper electrode 146 so as to convert the high frequency electrical signal into mechanical vibrations.

The first piezoelectric body 144 may have a predetermined thickness and be formed by a suitable thin film deposition process such as, for example, sputtering, CVD, or evaporation, and may be given a suitable predetermined shape using, for example, photolithography. In some embodiments, the shape of the first piezoelectric body 144 may be the same as the shape of the first lower electrode 142. In some embodiments, the first piezoelectric body 144 may have a smaller area than the first lower electrode 142, but larger than the area of the void 122-1 on which it is disposed. The thickness of the first piezoelectric body 144 is determined by considering factors including, but not limited to, intrinsic acoustic impedance or density, speed of sound, and wavelength of applied or desired signal.

The first upper electrode 146 may be formed on a top surface of the first piezoelectric body 144. Thus, the first piezoelectric body 144 may be disposed (or sandwiched) between the first lower electrode 142 and the first upper electrode 146. The first lower electrode 142 and the first upper electrode 146 are used for applying the high frequency electrical signal to the first piezoelectric body 144. The first upper electrode 146 may be formed of a suitable electrically conducting material. Examples of suitable materials for the first upper electrode 146 include, but are not limited to, metals such as manganese (Mn), gold (Au), aluminum (Al), copper (Cu), and silver (Ag), or conducting alloys thereof. The first upper electrode 146 may have a predetermined thickness and be formed by any suitable thin film deposition process such as, for example, sputtering method, CVD, and evaporation, and may be given a suitable predetermined shape using, for example, photolithography.

Because the first upper electrode 146 functions as an electrode and as a resonating unit at the same time, it is desirable to determine the thickness of the first upper electrode 146 with precision by considering factors including, without limitation, intrinsic acoustic impedance, density, speed of sound, and wavelength of an applied or desired signal.

The first trimming layer 148 is formed on a top surface of the first upper electrode 146. The first trimming layer 148 may have a predetermined thickness and be formed by a suitable thin film deposition process such as, for example, sputtering, CVD, and evaporation, after the first upper electrode 146 is formed, and may be sized to have a predetermined shape using, for example, photolithography.

It will be apparent after an understanding of the disclosure of this application that the thin film depositions processes for forming various components of the resonators (e.g., the electrodes, the piezoelectric bodies, and the trimming layers) are determined by the various materials being used for the respective components as well as compatibility of the processes with materials of already existing components.

The first trimming layer 148 may be formed of any suitable material amenable to thin film formation. Thus, the first trimming layer 148 may be formed of a metallic material such as, for example, manganese (Mn), gold (Au), aluminum (Al), copper (Cu), silver (Ag), or an alloy thereof, or an insulating material such as, for example, silicon oxide, silicon nitride, or aluminum oxide.

The first trimming layer 148 may be planarized and thinned to an appropriate thickness by an etching process such as, for example, reactive ion etching or ion beam etching in order to adjust a resonant frequency of the first resonator. In other words, the resonant frequency of the first resonator may be adjusted up to the vicinity of a desired target frequency by etching a portion or the entirety of the first trimming layer 148 to obtain a desired thickness of the first trimming layer 148. A detailed description of the planarization process will be provided below.

The second resonator 160 is disposed on the other of the voids 122-2. In some embodiments, the second resonator 160 may be a shunt resonator. In some embodiments, the second resonator 160 may be a bulk acoustic wave filter. In such embodiments, the second resonator 160 includes a second lower electrode 162, a second piezoelectric body 164, a second upper electrode 166, and a second trimming layer 168.

The second lower electrode 162 is disposed on the void 122-2, and serves to apply a high frequency voltage to the second piezoelectric body 164. Accordingly, the second lower electrode 162 may be formed of a suitable electrically conducting material such as, for example, manganese (Mn), gold (Au), aluminum (Al), copper (Cu), and silver (Ag), or conducting alloys thereof. The second lower electrode 162 may have a predetermined thickness and be formed by a suitable thin film deposition process such as, for example, sputtering, CVD, or evaporation. The second electrode 162 may have any suitable shape such as, for example, a circle, an ellipse, a square, a triangle, a convex regular or irregular polygon, or any other suitable shape that serves to optimize the geometric and acoustic efficiency of the resonators. The shape of the second lower electrode 162 can be provided using a suitable process such as, for example, photolithography.

Because the second lower electrode 162 may be a component forming the second resonator 160, thickness of the second lower electrode 162 is determined by considering factors such as, for example, intrinsic acoustic impedance or density of the material, speed of sound, wavelength of an applied or desired signal, and the like in order for the bulk acoustic wave (BAW) resonator to exhibit desired resonance characteristics.

The second lower electrode 162 may be formed at the same time as the formation of the first lower electrode 142. Thus, the material and thickness of the second lower electrode 162 may be the same as that of the first lower electrode 142.

However, the second lower electrode 162 is not limited thereto, but may be formed by a process different from the first lower electrode 142, and thus, may have a different material and thickness than the first lower electrode 142.

In addition, the second lower electrode 162 may be sized such that the second lower electrode 162 seals the void 122-2 from the top.

The second piezoelectric body 164 is formed on a top surface of the second lower electrode 162. In such configuration, the second lower electrode 162 is between the substrate 120 and the second piezoelectric body 164. The second piezoelectric body 164 may be formed of a suitable piezoelectric material such as, for example, quartz, zinc oxide (ZnO), aluminum nitride (AlN), lead zirconate titanate (PZT), barium titanate (BaTiO$_3$), or variations thereof. In addition, the second piezoelectric body 164 may be stretched according to a high frequency electrical signal applied by the second lower electrode 162 and the second upper electrode 166 so as to convert the electrical signal into mechanical vibrations.

The second piezoelectric body 164 may have a predetermined thickness and be formed by a suitable thin film deposition process such as, for example, sputtering, CVD, or evaporation, and may be given a suitable predetermined shape using, for example, photolithography. In some embodiments, the shape of the second piezoelectric body 164 may be the same as the shape of the second lower electrode 162. In some embodiments, the second piezoelectric body 164 may have a smaller area than the second lower electrode 162, but larger than the area of the void 122-2 on which it is disposed. The thickness of the second piezoelectric body 164 is determined by considering factors including, but not limited to, intrinsic acoustic impedance or density, speed of sound, wavelength of applied or desired signal.

The second piezoelectric body 164 may be shaped simultaneously with the first piezoelectric body 144, or may be shaped by a separate process. Similarly, the thickness of the second piezoelectric body 164 may also be same or different from the thickness of the first piezoelectric body 144.

The second upper electrode 166 is formed on a top surface of the second piezoelectric body 164. Thus, the second piezoelectric body 164 may be disposed (or sandwiched) between the second lower electrode 162 and the second upper electrode 166. The second lower electrode 162 and the second upper electrode 166 are used for applying the high frequency electrical signal to the second piezoelectric body 164. The second upper electrode 166 may be formed of a suitable electrically conducting material. Examples of suitable materials for the second upper electrode 166 include, but are not limited to metals such as manganese (Mn), gold (Au), aluminum (Al), copper (Cu), and silver (Ag), or alloys thereof. The second upper electrode 166 may have a predetermined thickness and be formed by any suitable thin film deposition process such as, for example, sputtering, CVD, and evaporation, and may be given a suitable predetermined shape using, for example, photolithography.

Because the second upper electrode 166 functions as an electrode and as a resonating unit at the same time, it is desirable to determine the thickness of the second upper electrode with precision by considering factors including but not limited to, intrinsic acoustic impedance or density, speed of sound, wavelength of an applied or desired signal.

The second upper electrode 166 may be shaped simultaneously with the first upper electrode 146, or may be shaped by a separate process. In addition, the thickness of the second upper electrode 166 may be same or different from the thickness of the first upper electrode 146.

The second trimming layer 168 is formed on a top surface of the second upper electrode 166 The second trimming layer 168 may have a predetermined thickness and be formed by a suitable thin film deposition process such as, for example, sputtering, CVD, and evaporation, after the second upper electrode 166 is formed, and may be sized to have a predetermined shape using, for example, photolithography.

The second trimming layer 168 may be formed of any suitable material amenable to thin film formation. Thus, the second trimming layer 168 may be formed of a metallic material such as, for example, manganese (Mn), gold (Au), aluminum (Al), copper (Cu), silver (Ag) or an alloy thereof, or an insulating material such as, for example, silicon oxide, silicon nitride, or aluminum oxide.

However, the second trimming layer 168 is formed of a material having a different etching rate for a given etchant than that of the first trimming layer 148. In some embodiments, the difference between the etching rates of the second trimming layer 168 and the first trimming layer 148 is such that when one of them is being etched, the other is not etched, or has negligible etching.

For example, the etching rates, for a given etchant, of the first trimming layer 148 and second trimming layer and 168 may be different such second trimming layer 168 is not planarized during planarization of the first trimming layer 148.

The second trimming layer 168 may be planarized for adjusting a bandwidth of the acoustic wave filter 100. The bandwidth is adjusted by moving a resonant frequency of the second resonator 160 up to the vicinity of a desired target frequency. However, the second trimming layer 168 is planarized only if required even after a portion or the entirety of the first trimming layer 148 has been etched.

The process of planarizing the second trimming layer 168, if needed, may be performed by a suitable process such as, for example, reactive ion etching or ion beam etching.

As described above, because the first trimming layer 148 and the second trimming layer 168 have the difference in their respective etching rates such that the process of planarizing one does not affect the other, additional fabrication processes such as, for example, an additional photomask process, or photolithography may be avoided. As a result, a fabrication yield and precision may be improved.

Hereinafter, a method for manufacturing an acoustic wave filter according to an embodiment will be described with reference to the drawings.

FIG. 2 schematically illustrates a cross-section of the acoustic wave filter during manufacturing using a method according to an embodiment.

Referring to FIG. 2, the voids 122 (122-1, 122-2) are formed in the substrate 120. The substrate 120 may be, for example, a silicon wafer, or a SoI wafer, and the voids 122 may be formed through an etching process such as, for example, wet etching, reactive ion etching, ion milling, or ion beam etching using suitable reactants. For example, in embodiments where a silicon substrate is to be etched using a wet etching process, potassium hydroxide, tetramethyl ammonium hydroxide (TMAH), or TMAH-isopropyl alcohol may be used as an etchant for anisotropic etching of the silicon substrate. In other embodiments, a solution of hydrofluoric acid (HF) and nitric acid ($HNO_3$) may be used for isotropic etching of silicon. Dry etching process (e.g., RIE) may use plasma of gases such as, for example, $CF_4$, $SF_6$, or $NF_3$.

The voids 122 may have a cross section of approximately a trapezoidal shape, as illustrated in FIG. 2. That is, the void 122 may have a funnel shape obtained, for example, using an anisotropic etch. Although FIG. 2 illustrates an example in which the voids 122 have the trapezoidal shape, the shape of the voids 122 is not limited thereto. For example, the shape of the voids 122 may be variously varied.

FIG. 3 schematically illustrates a cross-section of the acoustic wave filter during forming first and second lower electrodes of the acoustic wave filter.

Referring to FIG. 3, the first lower electrode 142 is formed on a top surface of a first void 122-1, and the second lower electrode 162 is formed on a top surface of a second void 122-2. The first lower electrode 142 and the second lower electrode 162 may be formed of a metallic material such as, for example, manganese (Mn), gold (Au), aluminum (Al), copper (Cu), silver (Ag) or an alloy thereof, and may have a predetermined thickness. Suitable thin film deposition process such as, for example, sputtering, CVD, or evaporation may be used to form the first lower electrode 142 and the second lower electrode 162. The electrodes may be shaped to have a predetermined shape using, for example, photolithography.

The first and second lower electrodes 142 and 162 may be components forming the first and second resonators 140 and 160, respectively, and thicknesses of the first and second lower electrodes 142 and 162 may be determined by considering factors such as, for example, intrinsic acoustic impedance or density of the material, speed of sound, and a wavelength of a desired or applied signal in order for the bulk acoustic wave (BAW) resonator to exhibit required resonance characteristics.

Although FIG. 3 illustrates an embodiment in which the first lower electrode 142 and the second lower electrode 162 are simultaneously formed, the process is not limited thereto. In other words, in an embodiment where the first and second lower electrodes 142 and 162 are formed of different materials, after the first lower electrode 142 is formed, the second lower electrode 162 may be separately formed. Alternatively, after the second lower electrode 162 is formed, the first lower electrode 142 may be separately formed.

Figure 4:
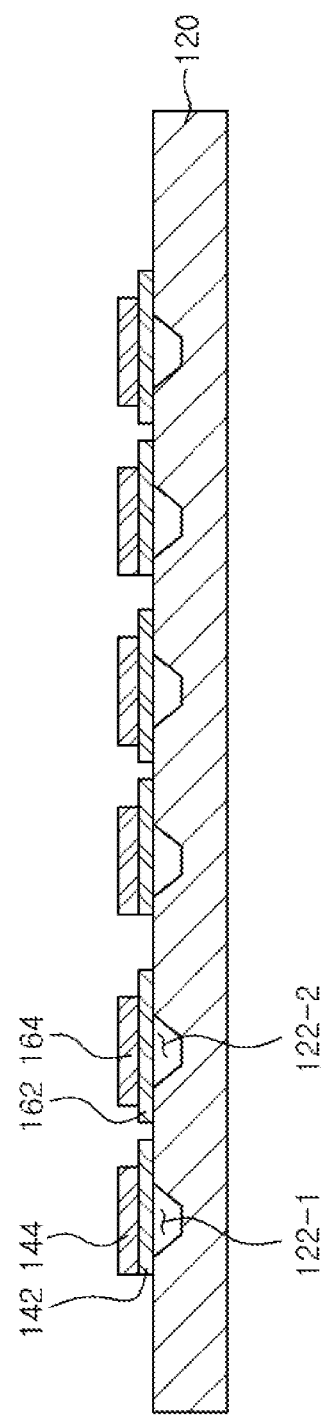
FIG. 4 schematically illustrates a cross-section of the acoustic wave filter during forming first and second piezoelectric bodies of the acoustic wave filter.

FIG. 4 schematically illustrates a cross-section of the acoustic wave filter during forming first and second piezoelectric bodies of the acoustic wave filter.

Referring to FIG. 4, the first piezoelectric body 144 is formed on the top surface of the first lower electrode 142, and the second piezoelectric body 164 is formed on the top surface of the second lower electrode 162. Examples of materials that may be used for the first piezoelectric body 144 and the second piezoelectric body 164 include, but are not limited to, quartz, zinc oxide (ZnO), aluminum nitride (AlN), lead zirconate titanate (PZT), barium titanate ($BaTiO_3$), or any combinations or variations thereof, and may have a predetermined thickness.

The first and second piezoelectric bodies 144 and 164 may also be formed on the first and second lower electrodes 142 and 162 at a predetermined thickness. Examples of processes for forming a thin film include, without limitation, sputtering, CVD, evaporation, and pulsed laser deposition. The first piezoelectric body 144 and the second piezoelectric body 164 may be shaped using, for example, photolithography. The thicknesses of the first and second piezoelectric bodies 144 and 164 are be determined by considering factors such as, for example, intrinsic acoustic impedance or density, speed of sound, and a wavelength of an applied or desired signal.

As with the first lower electrode 142 and the second lower electrode 162, although FIG. 4 illustrates an embodiment in which the first piezoelectric body 144 and the second piezoelectric body 164 are simultaneously formed, the process is not limited thereto. the first and second piezoelectric bodies 144 and 164 may also be formed by different processes. In other words, in an embodiment where the first and second piezoelectric bodies 144 and 164 are formed of different materials, after the first piezoelectric body 144 is formed, the second piezoelectric body 164 may be separately formed. Further, after the second piezoelectric body 164 is formed, the first piezoelectric body 144 may be separately formed.

Figure 5:
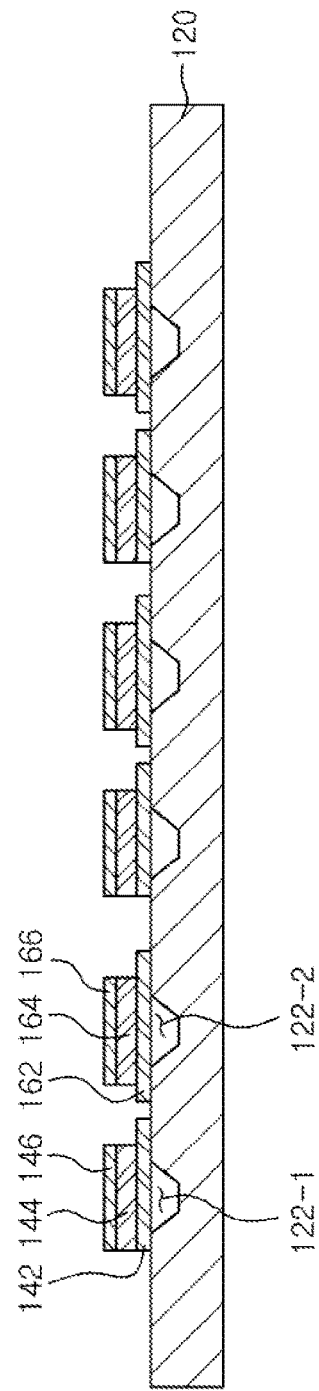
FIG. 5 schematically illustrates a cross-section of the acoustic wave filter during forming first and second upper electrodes of the acoustic wave filter.

FIG. 5 schematically illustrates a cross-section of the acoustic wave filter during forming first and second upper electrodes of the acoustic wave filter.

Referring to FIG. 5, the first upper electrode 146 is formed on the top surface of the first piezoelectric body 144, and the second upper electrode 166 is formed on the top surface of the second piezoelectric body 164. The first upper electrode 146 and the second upper electrode 166 may be formed of a metallic material such as, for example, manganese (Mn), gold (Au), aluminum (Al), copper (Cu), silver (Ag) or an alloy thereof, and may have a predetermined thickness. Suitable thin film deposition process such as, for example, sputtering, CVD, or evaporation may be used to form the first upper electrode 146 and the second upper electrode 166. The electrodes may be shaped to have a predetermined shape using, for example, photolithography.

Although FIG. 5 illustrates an embodiment in which the first upper electrode 146 and the second upper electrode 166 are simultaneously formed, the process is not limited thereto. The first and second upper electrodes 146 and 166 may also be formed by different processes. In other words, in an embodiment where the first and second upper electrodes 146 and 166 are formed of different materials, after the first upper electrode 146 is formed, the second upper electrode 166 may be separately formed. Alternatively, after the second upper electrode 166 is formed, the first upper electrode 146 may be separately formed.

Figure 6:
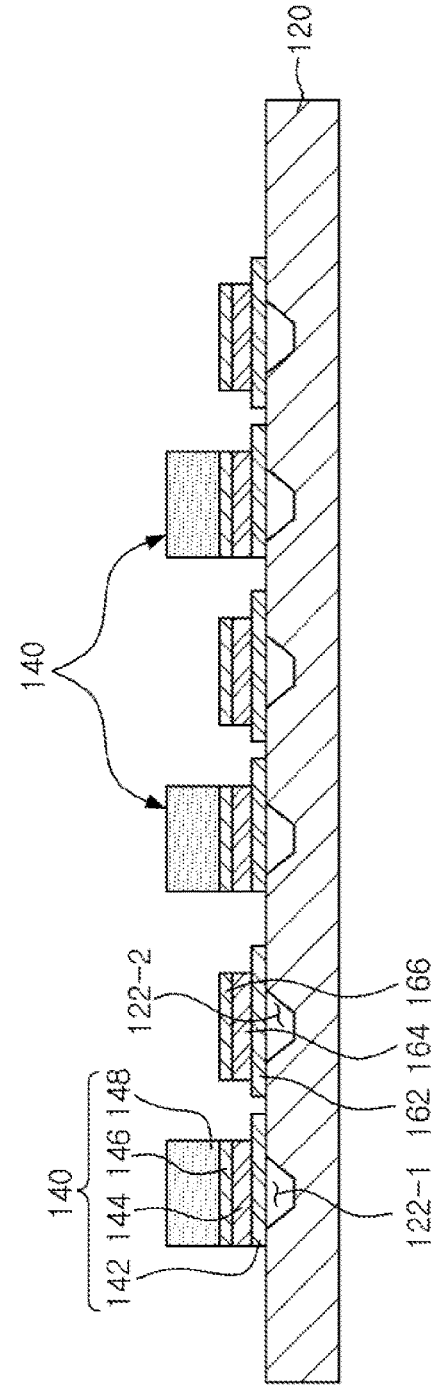
FIG. 6 schematically illustrates a cross-section of the acoustic wave filter during forming a first trimming layer of the acoustic wave filter.

FIG. 6 schematically illustrates a cross-section of the acoustic wave filter during forming a first trimming layer of the acoustic wave filter.

Referring to FIG. 6, the first trimming layer 148 is formed on the top surface of the first upper electrode 146. As an example, the first trimming layer 148 may have a predetermined thickness, and may be formed using a thin film deposition process such as, for example, sputtering, CVD, evaporation, and pulsed laser deposition. after the first upper electrode 146 is formed. The first trimming layer 148 may be shaped to have a predetermined shape using, for example, photolithography.

Material of the first trimming layer 148 is not particularly limited, but when it is considered that the first trimming layer 148 is formed by the process of forming a thin film, the first trimming layer 148 may be formed of a metallic material such as manganese (Mn), gold (Au), aluminum (Al), copper (Cu), silver (Ag) or an alloy thereof, or an insulating material such as, for example, silicon oxide, silicon nitride, or aluminum oxide.

FIG. 7 schematically illustrates a cross-section of the acoustic wave filter during forming a second trimming layer of the acoustic wave filter.

Referring to FIG. 7, after the first trimming layer 148 is formed, the second trimming layer 168 is formed on the top surface of the second upper electrode 166. As an example, the second trimming layer 168 may have a predetermined thickness, and may be formed using a thin film deposition process such as, for example, sputtering, CVD, evaporation, or pulsed laser deposition after the second upper electrode 166 is formed, and may be shaped to a predetermined shape using, for example, photolithography.

As with the first trimming layer 148, material of the second trimming layer 168 is not particularly limited, may include, for example, a metallic material such as manganese (Mn), gold (Au), aluminum (Al), copper (Cu), silver (Ag) or an alloy thereof, or an insulating material such as silicon oxide, silicon nitride, or aluminum oxide.

However, the second trimming layer 168 is formed of a material having a different etching rate than that of the first trimming layer 148. In other words, the second trimming layer 168 and the first trimming layer 148 have a difference between the respective etching rates such that when one of them is being etched, the other is not etched, or has negligible etching.

For example, the etching rates of the first trimming layer 148 and the second trimming layer 168 may be different such the second trimming layer 168 is not planarized during planarization of the first trimming layer 148.

FIG. 8 schematically illustrates a cross-section of the acoustic wave filter during planarizing the first trimming layer of the acoustic wave filter.

Referring to FIG. 8, a process of planarizing the first trimming layer 148 of the acoustic wave filter 100 may be performed by reactive ion etching or ion beam etching in order to adjust a resonant frequency of the first resonator 140.

In other words, the resonant frequency of the first resonator may be adjusted up to the vicinity of a desired target frequency by etching a portion or the entirety of the first trimming layer 148 to obtain a desired thickness of the first trimming layer 148.

In this case, the use of a photomask on the second trimming layer 168 may be avoided. That is, because the first and second trimming layers 148 and 168 have different etching rate, the photomask for preventing the second trimming layer 168 from being etched may not be required.

Figure 9:
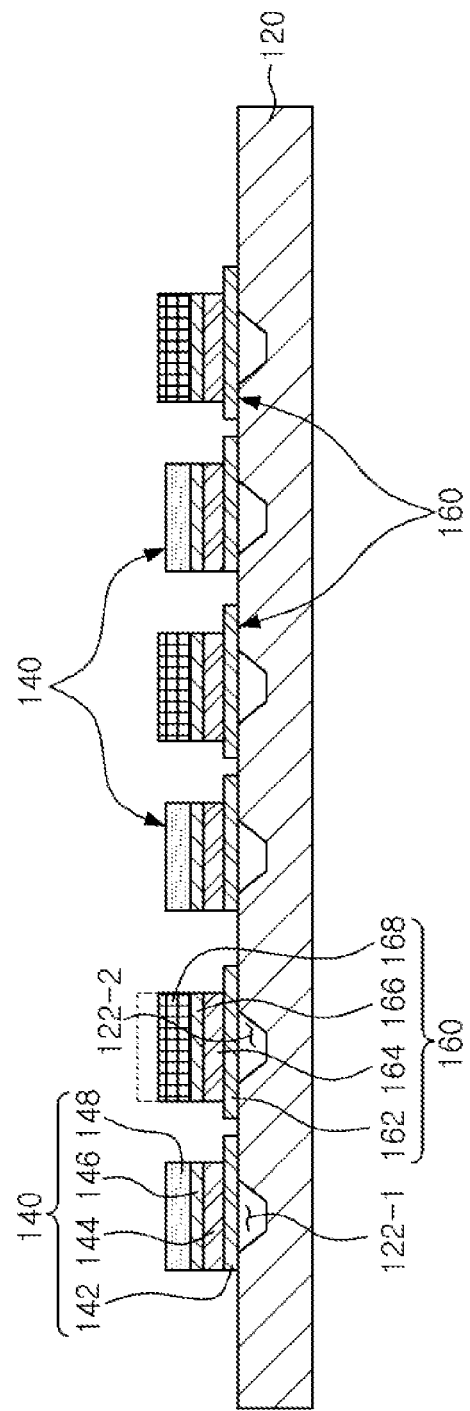
FIG. 9 schematically illustrates a cross-section of the acoustic wave filter during planarizing the second trimming layer of the acoustic wave filter.

FIG. 9 is schematically illustrates a cross-section of the acoustic wave filter during planarizing the second trimming layer of the acoustic wave filter.

Referring to FIG. 9, the second trimming layer 168 may be planarized by a bandwidth planarization process. The bandwidth of the acoustic wave filter may be adjusted by planarizing the second trimming layer 168 to move a target frequency after planarizing the first trimming layer 148 to adjust the resonant frequency up to the vicinity of a desired target frequency by first etching a portion or the entirety of the first trimming layer 148.

The process of planarizing the second trimming layer 168 may be performed, for example, by reactive ion etching or ion beam etching.

In addition, providing a photomask on the first trimming layer 148 may be avoided at the time of the process of planarizing the second trimming layer 168 because of the difference in etching rates of the first trimming layer 148 and the second trimming layer 168.

As described above, because the first and second trimming layers 148 and 168 have the difference of the etching rate for a given etchant which does not have an influence on the first trimming layer 148 and the second trimming layer 168 at the time of the process of planarizing the first trimming layer 148 and the second trimming layer 168, fabrication processes such as, for example, an additional photomask process, or photolithography may be avoided. Thus, a fabrication yield and precision may be improved.

Although specific terminology has been used in this disclosure, for example, resonating part, it will be apparent after an understanding of the disclosure of this application that different terminology may be used to describe the same features, and such different terminology may appear in other applications.

As set forth above, according to the embodiments in the present disclosure, the fabrication yield may be improved, and the degree of precision may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave filter comprising:
a substrate having voids formed therein;
a first resonator disposed on one or more of the voids;
a second resonator disposed on another of the voids;
a first trimming layer disposed in the first resonator and comprising a first material selected from the group consisting of Mn, Al, Cu, Ag, and an alloy of Mn, Al, Cu, or Ag; and
a second trimming layer disposed in the second resonator, and comprising a second material different from the first material and selected from the group consisting of Mn, Al, Cu, Ag, and an alloy of Mn, Al, Cu, or Ag,
wherein the first and second materials have respective etching rates for a given etchant that are configured to prevent one of the first and second trimming layers from being etched by the given etchant while the other of the first and second trimming layers is etched by the given etchant.

2. The acoustic wave filter of claim 1, wherein the first resonator comprises:
a first lower electrode disposed on a corresponding void;
a first piezoelectric body disposed on a top surface of the first lower electrode;
a first upper electrode disposed on a top surface of the first piezoelectric body; and
the first trimming layer disposed on a top surface of the first upper electrode,
wherein the top surface of the first lower electrode is disposed opposite a bottom surface of the first lower electrode, and the bottom surface of the first lower electrode faces the corresponding void.

3. The acoustic wave filter of claim 2, wherein the second resonator comprises:
a second lower electrode disposed on a corresponding void;
a second piezoelectric body disposed on a top surface of the second lower electrode;
a second upper electrode disposed on a top surface of the second piezoelectric body; and
the second trimming layer disposed on a top surface of the second upper electrode,
wherein the top surface of the second lower electrode is disposed opposite a bottom surface of the second lower electrode, and the bottom surface of the second lower electrode faces the corresponding void.

4. The acoustic wave filter of claim 1, wherein the voids are funnel-shaped and have a wide upper portion and a narrow lower portion.

5. The acoustic wave filter of claim 4, wherein the first lower electrode and the second lower electrode are sized to cover and seal the upper portion of corresponding voids.

6. A method of manufacturing an acoustic wave filter, the method comprising:
forming voids in a substrate;
forming a first lower electrode and a second lower electrode to be disposed on the voids;
forming a first piezoelectric body and a second piezoelectric body on the first lower electrode and the second lower electrode respectively;
forming a first upper electrode and a second upper electrode on the first piezoelectric body and the second piezoelectric body respectively;
forming a first trimming layer on the first upper electrode; and
forming a second trimming layer on the second upper electrode,
wherein the first trimming layer comprises a first material selected from the group consisting of Mn, Al, Cu, Ag, and an alloy of Mn, Al, Cu, or Ag, the second trimming layer comprises a second material different from the first material and selected from the group consisting of Mn, Al, Cu, Ag, and an alloy of Mn, Al, Cu, or Ag, and the first and second materials have respective etching rates for a given etchant that are configured to prevent one of the first and second trimming layers from being etched by the given etchant while the other of the first and second trimming layers is etched by the given etchant.

7. The method of claim 6, further comprising, after forming the second trimming layer, planarizing the first trimming layer.

8. The method of claim 7, wherein the planarizing of the first trimming layer comprises etching a portion of the first trimming layer.

9. The method of claim 8, wherein the planarizing of the first trimming layer comprises one of reactive ion etching and ion beam etching.

10. The method of claim 8, further comprising, after planarizing the first trimming layer, planarizing the second trimming layer.

11. The method of claim 10, wherein the planarizing of the second trimming layer comprises etching a portion of the second trimming layer.

12. The method of claim 11, wherein the planarizing of the second trimming layer comprises one of reactive ion etching and ion beam etching.

13. The method of claim 6, wherein the forming of the first trimming layer comprises:
stacking the first trimming layer; and
planarizing the first trimming layer through etching.

14. The method of claim 6, wherein the forming of the second trimming layer comprises:
   stacking the second trimming layer; and
   planarizing the second trimming layer through etching.

15. An acoustic wave filter, comprising:
   a first acoustic resonator having a first trimming layer disposed thereon; and
   a second acoustic resonator having a second trimming layer disposed thereon,
   wherein the first trimming layer is formed of a first material selected from the group consisting of Mn, Al, Cu, Ag, and an alloy of Mn, Al, Cu, or Ag, the second trimming layer is formed of a second material different from the first material and selected from the group consisting of Mn, Al, Cu, Ag, and an alloy of Mn, Al, Cu, or Ag, and the first and second materials have respective etching rates for a given etchant configured such that the given etchant etches one of the first and second trimming layers and causes no or negligible etching of the other of the first and second trimming layers.

16. The acoustic wave filter of claim 15, wherein the first acoustic resonator and the second acoustic resonator each comprise a lower electrode disposed on a void provided in a substrate, a piezoelectric body disposed on the lower electrode, and an upper electrode disposed on the piezoelectric body.

\* \* \* \* \*